US008163636B2

(12) United States Patent
Chevalier

(10) Patent No.: US 8,163,636 B2
(45) Date of Patent: Apr. 24, 2012

(54) METHOD OF PREPARING P-TYPE DOPED ZNO OR ZNMGO

(75) Inventor: Céline Chevalier, Echirolles (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 12/409,957

(22) Filed: Mar. 24, 2009

(65) Prior Publication Data

US 2009/0246948 A1 Oct. 1, 2009

(30) Foreign Application Priority Data

Mar. 27, 2008 (FR) .................................... 08 51967

(51) Int. Cl.
*H01L 21/265* (2006.01)
*H01L 21/425* (2006.01)
(52) U.S. Cl. ........ 438/519; 438/522; 438/527; 438/530; 257/E21.473
(58) Field of Classification Search .................. 438/514, 438/515, 518, 519, 522, 527, 530
See application file for complete search history.

(56) References Cited

U.S. PATENT DOCUMENTS

| | | | | |
|---|---|---|---|---|
| 2004/0104392 A1* | 6/2004 | Ishizaki | ............................ | 257/79 |
| 2007/0235796 A1 | 10/2007 | Lee et al. | | |
| 2007/0238314 A1* | 10/2007 | Buretea et al. | ................ | 438/775 |

FOREIGN PATENT DOCUMENTS

| | | | |
|---|---|---|---|
| GB | 2 361 480 A | | 10/2001 |
| JP | 2004-207721 A | | 7/2004 |
| JP | 2005-347525 | | 12/2005 |
| WO | WO 2007/117158 A1 | | 10/2007 |
| WO | WO 2007117158 A1 * | | 10/2007 |

OTHER PUBLICATIONS

Database WPI Week 200671, Thomson Scientific, London Nov. 11, 2005, XP-002502835.
Vaithianathan et al., "Doping of As, P and N in Laser deposited ZnO Films", Journal of Crystal Growth, vol. 287, No. 1 dated Jan. 18, 2006, pp. 85-88.
Chen et al., "Annealing Process of Ion-Implantation-Induced Defects in ZnO: Chemical Effect on the Ion Species", Journal of Applied Physics 99, 093507 (2006), pp. 093507-1 to 093507-5.
Chen et al., "Interaction of Nitrogen with Vacancy Defects in $N^+$-implanted ZnO Studied Using a Slow Positron Beam", Applied Physics Letters 87, 2005, pp. 091910-1 to 091910-3.
Zhao et al., "Deep-level Emissions Influenced by O and Zn Implantations in ZnO", Applied Physics Letters 87, 2005, pp. 211912-1 to 211912-3.
Vijayakumar et al., "Effects of Oxygen Ion Implantation in Spray-Pyrolyzed ZnO Thin Films", Phys. Stat. sol. 203, No. 5, 2006, pp. 860-867.

* cited by examiner

*Primary Examiner* — Charles Garber
*Assistant Examiner* — Calvin Choi
(74) *Attorney, Agent, or Firm* — Miles & Stockbridge P.C.

(57) ABSTRACT

Method of preparing p-type doped ZnO or p-type doped ZnMgO, in which the following successive steps are carried out:
 a) implantation of O+ oxygen ions in an n-type doped ZnO or an n-type doped ZnMgO;
 b) first annealing at a temperature less than or equal to 1200° C. under oxygen for a time greater than or equal to 5 minutes;
 c) implantation of at least one ion of an element chosen among the elements of group I or the elements of group V of the periodic table;
 d) second annealing.
The p-type doped ZnO or ZnMgO obtained by this method may be used in an optoelectronic device such as a light emitting diode.

13 Claims, 1 Drawing Sheet

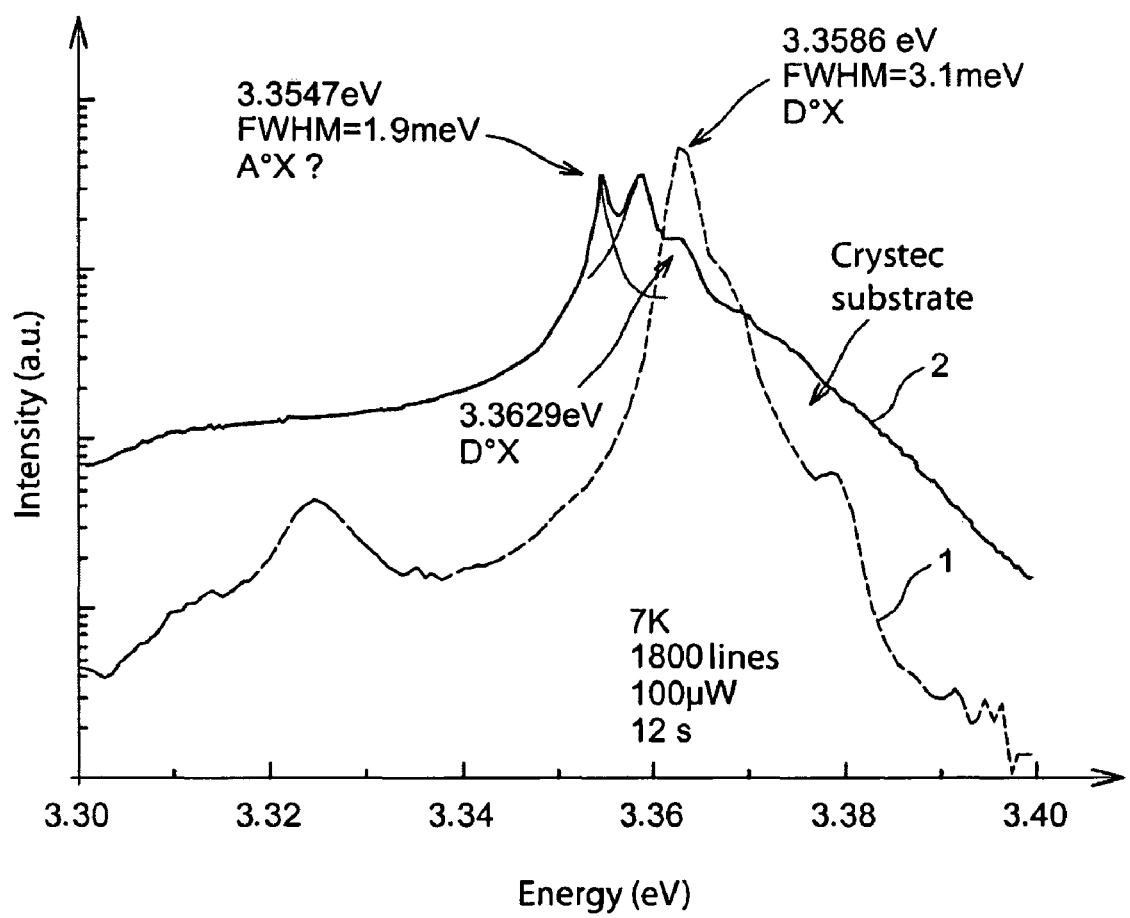

METHOD OF PREPARING P-TYPE DOPED ZNO OR ZNMGO

The invention relates to a method of preparing p-type doped ZnO or p-type doped ZnMgO.

TECHNICAL FIELD

The technical field of the invention may in a general manner be defined as that of the preparation, production of p-type doped zinc oxide ZnO or ZnMgO alloy, in other words having a p-type conductivity, from non doped ZnO or ZnMgO alloy, in other words having an intrinsic n-type conductivity.

Zinc oxide ZnO is a semi-conductor material that has numerous applications in optoelectronics, in particular in LEDs for lighting in the form of 2D thin films and nanowires.

The preparation of p-type doped zinc oxide ZnO has proved to be difficult.

The implantation of ions has been used to prepare zinc oxide doped with acceptor type dopants such as nitrogen or phosphorous but it turns out that the implanted layer does not have p-type conductivity.

BACKGROUND ART

Few works exist on oxygen implantations in ZnO and none discloses the possibility of p-type doping by means of an oxygen implantation.

Indeed, the documents describing the results obtained after implantation of oxygen in ZnO essentially relate to the characterisation of defects created by the implantation.

Document [1] of Chen et al. describes the implantation of O+ or B+ ions in non doped ZnO having an n-type conductivity. After the implantation, the samples are annealed at a temperature from 200° C. to 1000° C. for a time of 30 minutes under nitrogen. An annealing temperature from 900° C. to 1000° C. is necessary to eliminate the microvoids in the samples implanted by B+ ions, whereas a temperature of 700° C. to 800° C. is sufficient to eliminate the vacancies in the samples implanted by O+ ions.

No electrical characterisation result demonstrating a p-type conductivity is provided in this document.

Document [2] of Chen et al. shows by "positron annihilation" or by "Raman" studies the evolution of vacancy clusters induced by implantation, depending on the recovery annealing temperature, for samples of ZnO implanted with N+, O+, or Al+ ions alone or co-implanted with O+/N+ or Al+/N+ ions. In the samples implanted with N+ ions and the samples co-implanted with Al+/N+ ions, the vacancy clusters are only partially eliminated by annealing at 800° C., whereas they are completely eliminated in the samples implanted with O+ or Al+ ions by annealing at 800° C.-900° C. In the samples co-implanted with O+/N+ ions, most of the vacancy clusters are eliminated at 800° C., during another annealing at 1000° C.-1100° C., the nitrogen also forms stable complexes with the thermally generated vacancies. It is shown in this document that an annealing at 1200° C.-1250° C. makes it possible to eliminate these vacancy complexes formed by the implantation of nitrogen but no electrical characterisation result demonstrating a p-type conductivity is provided.

Document [3] of Zhao et al. discloses photoluminescence characterisation results of samples of ZnO implanted by oxygen and zinc then annealed in oxygen for 10 minutes at 500° C., then for 10 minutes at 700° C., which reveal the existence of a peak which may correspond to the presence of an OZn antisite.

This hypothesis is moreover confirmed in document [4] of Vijayakumar et al. in which is revealed by optical absorption, in samples of ZnO implanted by oxygen ions and without annealing, the presence of levels attributed to Zn vacancies (VZn), OZn antisites and oxygen vacancies (VO).

The Hall effect measurements performed in this document [4] also show a considerable increase in the resistivity of the implanted layers and an increase in the concentration of carriers.

Document [5] describes a method of producing a buried semi-insulating ZnO layer co-implanted by oxygen and nitrogen ions, for "MESFET".

Oxygen and nitrogen ions are implanted together, simultaneously in equal quantities in a surface layer of zinc oxide and said layer is subjected to a thermal treatment at 800° C.

The square of the resistivity measured by Hall effect of the semi-insulating layer formed by the co-implantation followed by annealing is given at $10^7 \Omega/\square$.

Consequently, in view of the foregoing, there exists a need that has not yet been met for a method of preparing p-type doped zinc oxide ZnO which has effectively a p-type behaviour.

There also exists a need for a method of preparing p-type doped zinc oxide ZnO that is simple and reliable.

DESCRIPTION OF THE INVENTION

The aim of the present invention is to provide a method of preparing p-type doped zinc oxide ZnO which meets, among others, the abovementioned requirements.

This aim, and yet others, are attained according to the invention by a method of preparing p-type doped ZnO or p-type doped ZnMgO, in which the following successive steps are carried out:

a) implantation of O+ oxygen ions in an n-type doped ZnO or an n-type doped ZnMgO;

b) first annealing at a temperature less than or equal to 1200° C. under oxygen for a time greater than or equal to 5 minutes;

c) implantation of at least one ion of an element chosen among the elements of group I or the elements of group V of the periodic table;

d) second annealing.

According to the invention, n-type doped ZnO or n-type doped ZnMgO is taken to mean that said ZnO or said ZnMgO intrinsically has an n-type conductivity, in other words that said ZnO or said ZnMgO has not been intentionally, voluntarily n-type doped but has said doping, said n-type conductivity in an intrinsic, inherent manner.

Said non intentionally, non voluntarily n-type doped ZnO or ZnMgO is also designated by the terms non (intentionally) doped ZnO or ZnMgO.

Advantageously, the implantation of oxygen ions is carried out at ambient temperature (namely generally 15° C. to 30° C., more specifically 20° C. to 25° C., for example 22° C. or 23° C.) with one (or several) energy (energies) from 100 keV to 300 keV, preferably 300 keV, and with a minimum total dose of $10^{15}$ cm$^{-2}$ for the implantation of oxygen ions.

Advantageously, the first annealing, which is carried out at a temperature less than or equal to 1200° C., for a time greater than or equal to 5 minutes, for example greater than or equal to 15 minutes, may be carried out at from 1000° C. to 1200° C. for a time at least equal to 5 minutes, for example at least equal to 15 minutes.

Advantageously, in step c), the implantation of an N, or P, or Li ion is carried out.

Advantageously, the implantation of step c) is carried out at ambient temperature with an energy from 200 keV to 300 keV, preferably 250 keV, and with a minimum total dose of $10^{15}$ cm$^{-2}$ for the ion implantation.

Advantageously, the second annealing is carried out at a temperature from 200° C. to 1000° C., preferably from 400° C. to 800° C. for a time of at least one minute, preferably from 1 to 60 minutes.

Advantageously the second annealing is carried out under nitrogen, or under oxygen or under a mixture of oxygen and nitrogen.

The method according to the invention comprises a specific sequence of specific steps which is neither described, nor suggested in the prior art as represented in particular by the documents cited above.

According to the invention, the preimplantation of oxygen during the first step, and the intermediate annealing during the second step of the method according to the invention, enable a compensation of the donor defects intrinsic to the material and the creation of acceptor defects at low temperature attested by a p-type behaviour measured up to 150K. The p-type doping by extrinsic impurity is then carried out by an ion implantation of an I or V element, followed by an annealing, called recovery annealing and activation of the dopants.

The method according to the invention is in particular fundamentally different to the method described in document [5]. Indeed, the method of document [5] recommends a co-implantation O$^+$+N$^+$ in order to form locally a buried semi-insulating layer, whereas in the method according to the invention, a pre-implantation of O+ is carried out, followed by an appropriate annealing that makes it possible to reveal a compensation of the donors intrinsically present in the implanted ZnO (or ZnMgO) by the effective measurement of a p-type conduction.

The method of the invention then recommends an implantation of an acceptor element for ZnO (or ZnMgO), for example; nitrogen, lithium or phosphorous followed by an appropriate annealing in order to enable a p-type doping of the SnO (or ZnMgO) stable up to ambient temperature by extrinsic acceptor type atoms.

The method according to the invention enables the preparation of p-type doped ZnO or p-type doped ZnMgO, for example ZnO, the p-type behaviour of which is effectively proven and demonstrated by the properties of the material obtained at the end of step b) of the method according to the invention.

The p-type doped ZnO or ZnMgO prepared by the method according to the invention may in particular be in the form of a 2D thin film, for example of a thickness from 500 nm to 1 μm or nanowires.

The n-type doped ZnO or ZnMgO subjected to the method according to the invention may in particular be in the form of a substrate for example solid, monolithic, and when it is subjected to the method of the invention a surface layer of said substrate is transformed respectively into p-type doped ZnO or ZnMgO.

The surface layer transformed into p-type doped ZnO or ZnMgO of this substrate, of this structure, generally has a thickness from 500 nm to 1 μm.

Such a compact, single piece structure has optical and electrical properties modified over a thickness between 500 nm and 1 μm.

The method according to the invention thus makes it possible to create acceptors having different optical and electrical properties over a given thickness from a monolithic substrate made of non (intentionally) n-type doped ZnO or ZnMgO.

It is thus possible to prepare easily by a simple method, and directly from a simple monolithic substrate, a p-n type junction without resorting for example to multiple growth steps.

Alternatively, the n-type doped ZnO or ZnMgO subjected to the method according to the invention may be in the form of nanowires.

Generally speaking, the p-type doped ZnO or ZnMgO prepared by the method according to the invention may be used in optoelectronics.

All sorts of optoelectronic devices may comprise p-type doped ZnO or ZnMgO prepared by the method according to the invention or the substrate, structure made of (non intentionally) n-type doped ZnO or ZnMgO, a surface layer of which has been respectively transformed into p-type doped ZnO or ZnMgO by the method according to the invention.

This electronic device may in particular be a light emitting diode (LED), in particular a UV LED.

BRIEF DESCRIPTION OF THE DRAWINGS

The invention will be better understood by reading the following detailed description given for purposes of illustration and in no way limiting and by referring to the appended FIGURE, in which:

FIG. 1 shows the photoluminescence spectrum (①) in dotted line) taken of an initially n-type doped ZnO material and the photoluminescence spectrum (②) in continuous line) taken of the ZnO material prepared in example 1.

The intensity (in arbitrary units, a.u.) is given on the abscissa, and the energy (eV) is given on the ordinate.

DETAILED DESCRIPTION OF SPECIFIC EMBODIMENTS

The method according to the invention comprises a first step during which the implantation of O+ oxygen ions is carried out in an initially n-type doped ZnO or ZnMgO, namely a non doped ZnO or ZnMgO having an n-type conductivity, this first step may also be called "preimplantation" step.

The ZnO is generally in the form of a monocrystal of a size for example of 1 cm×1 cm obtained for example by hydrothermal synthesis.

In the first step of the method according to the invention, the implantation of O+ oxygen ions in the ZnO or ZnMgO, non doped, is carried out.

The implantation of the first step of the method according to the invention may be carried out with any O+ ion implantation device.

This implantation is generally carried out at ambient temperature.

During this step, the oxygen vacancies are compensated by the oxygen atoms incorporated into the array by the implantation. The implantation thus generally has to be carried out with a sufficiently high dose so that the defects that are also created by the implantation, such as oxygen vacancies for example, are at lower concentration than the implanted oxygen atoms.

The implantation energy is one of the most important parameters to best optimise the creation of vacancy defects due to the implantation.

According to the invention, the implantation of oxygen ions is thus advantageously carried out at ambient temperature with an energy from 100 keV to 300 keV, preferably 300 keV, and with a minimum total dose of $10^{15}$ cm$^{-2}$ for the implantation of oxygen ions.

An energy of 300 keV and a minimum dose of $10^{15}$ cm$^{-2}$ give satisfactory results.

The second step of the method according to the invention which follows the first implantation or "preimplantation" step is an annealing step, also called "recovery annealing", or "intermediate annealing".

The recovery annealing after this first implantation has to take place at a sufficiently high temperature and for a sufficiently long time so that the implanted oxygen impurities are activated.

According to the invention, the annealing of the second step of the method or "recovery annealing" is carried out at a temperature less than or equal to 1200° C. for a time greater than or equal to 5 minutes.

Advantageously, this first annealing is carried out at a temperature from 1000° C. to 1200° C. for a time at least equal to 5 minutes, for example at least equal to 15 minutes.

The succession of the first step of preimplantation of oxygen and the second step of intermediate annealing makes it possible to compensate, fill, the donor type defects, intrinsic to the material, such as the oxygen vacancies, and to create acceptor defects at low temperature.

The fact that the donor type defects, intrinsic to the material, are filled is confirmed by the photoluminescence spectra at low temperature, as shown by the photoluminescence spectra of FIG. 1.

The existence of acceptor defects at low temperature reveals a p-type behaviour, measured up to 150 K as is shown in example 1 below.

The third step of the method according to the invention, following the second step of recovery annealing after the first pre implantation step, consists in a second implantation enabling a p-type doping by extrinsic impurity.

This second implantation is an implantation of any element of column I or column V replacing oxygen (which is at normal concentration thanks to the succession of the preceding first and the second steps) or any element, of column I replacing zinc.

Preferred ions for carrying out this implantation of the third step are N ions or P ions or Li ions.

The use of nitrogen ions to carry out this implantation of step c) is carried cut for example at ambient temperature with an energy from 200 keV to 300 keV, preferably 250 keV, and with a minimum total dose of $10^{15}$ cm$^{-2}$.

At the end of the third step of the method, namely the step of implantation of at least one ion of an element chosen among the elements of group I and the elements of group V of the periodic table, it is necessary to carry out a fourth step which is a step of recovery annealing and activation of the impurity, the dopant implanted during the third step. This step is also called, second annealing step.

This second annealing is generally carried out at a temperature from 200° C. to 1000° C., preferably from 400° C. to 800° C. for a time of at least one minute, preferably from 1 to 60 minutes.

Generally, this second annealing is carried out under nitrogen, or under oxygen or under a mixture of oxygen and nitrogen.

It should be noted that the temperature and the time of the second annealing depend on the type of ion implanted under oxygen.

The method according to the invention makes it possible to prepare p-type doped ZnO or ZnMgO which may be used for example in the form of 2D thin films or nanowires in the production of light emitting diodes (LEDs), particularly in the ultraviolet.

The invention will now be described in relation to the following example, given by way of illustration and in no way limiting.

Example 1

In this example, photoluminescence spectra have been taken of a sample of initially, intrinsically n-type doped ZnO, and of a sample of ZnO having undergone the successive steps a) and b) of the method according to the invention.

The measurement conditions are identical, namely a temperature of 7K, a grating of 1800 lines, a laser power of 100 µW and a spectrum integration time of 12 seconds.

The first spectrum (spectrum 1) is obtained on a sample of initially n-type doped ZnO, namely a ZnO before step a).

This sample of initially n-type doped ZnO undergoes step a) of oxygen implantation of the method according to the invention. The experimental conditions of this implantation are an energy of 300 keV with a minimum total dose of $10^{15}$ cm$^{-2}$.

An annealing step conforming to step b) of the method according to the invention is then carried out at a temperature of 1200° C. for a time of 15 minutes under oxygen.

The second photoluminescence spectrum (spectrum 2) has been obtained on the sample after steps a) and b) under the aforementioned conditions.

FIG. 1 shows this first and this second photoluminescence spectra 1, 2.

The first spectrum 1 shows in particular a peak situated at 3.36 eV. This is a peak associated with an exciton linked to a donor. Such a peak may be correlated with the n-type conductivity measured on the substrate.

This second spectrum 2 shows the appearance of two peaks situated at 3.3547 eV and 3.3586 eV.

The peak situated at 3.3629 eV, normally associated with an exciton linked to the aluminium donor observed in any type of ZnO is considerably reduced after the preimplantation of the first step and the annealing of the second step.

The peak situated at 3.3547 eV is a peak associated with an exciton linked to an acceptor (may be interstitial oxygen or zinc vacancies created by the implantation).

We checked by Hall effect up to 150K, a p-type behaviour for an annealing at 1200° C. for 15 minutes after implantation of oxygen with:

p~$6\times10^{13}$ at/cm$^2$ and µ~0.9 cm$^2$/Vs at 50K
p~$6.7\times10^{13}$ at/cm$^2$ and µ~2 cm$^2$/Vs at 100K
p~$2.4\times10^{14}$ at/cm$^2$ and µ~2.1 cm$^2$/Vs at 150K.

REFERENCES

[1] Z. Q. CHEN ET AL., "*Annealing process of ion-implantation-induced defects in ZnO: Chemical effect of the ion species*", Journal of Applied Physics 99, 093507 (2006).
[2] Z. Q. CHEN ET AL., "*Interaction of nitrogen with vacancy defects in N+-implanted ZnO studied using a slow positron beam*", Applied Physics Letters, 87, 091910 (2005).
[3] Q. X. ZHAO ET AL., "*Deep-level emissions influenced by O and Zn implantations in ZnO*", Applied Physics Letters 87, 211912 (2005).
[4] K. P. VIJAYAKUMAR ET AL., "*Effects of oxygen ion implantation in spray-pyrolyzed ZnO thin films*", Phys. Stat. Sol. (a) 203, No. 5, 860-867(2006).
[5] JP-A-2005 347 525.

The invention claimed is:

1. A method of preparing p-type doped ZnO or p-type doped ZnMgO, in which the following successive steps are carried out:
   a) implanting $O^+$ oxygen ions in an n-type doped ZnO or an n-type doped ZnMgO;
   b) performing a first annealing at a temperature less than or equal to 1200° C. under oxygen for a time greater than or equal to 5 minutes, whereby said ZnO or ZnMgO exhibits p-type behavior;
   c) implanting at least one ion of an element chosen from among the elements of group I and the elements of group V of the periodic table; and
   d) performing a second annealing.

2. The method according to claim 1, in which the implantation of oxygen ions is carried out at ambient temperature with one or more energies from 100 keV to 300 keV, and with a minimum total dose of $10^{15}$ cm$^{-2}$ for the implantation of the oxygen ions.

3. The method according to claim 2, in which said one or more energies is 300 keV.

4. The method according to claim 1, in which the first annealing is carried out at a temperature from 1000° C. to 1200° C. for a time at least equal to 5 minutes.

5. The method according to claim 1, in which in step c) implantation of an N, P, or Li ion is carried out.

6. The method according to claim 1, in which the implantation of step c) is carried out at ambient temperature with an energy from 200 keV to 300 keV, and with a minimum total dose of $10^{15}$ cm$^{-2}$ for the implantation of the ions.

7. The method according to claim 6, in which said energy is 250 keV.

8. The method according to claim 1, in which the second annealing is carried out at a temperature from 200° C. to 1000° C. for a time of at least one minute.

9. The method according to claim 8, in which the second annealing is carried out under nitrogen, or under oxygen, or under a mixture of oxygen and nitrogen.

10. The method according to claim 8, in which said temperature is from 400° C. to 800° C.

11. The method according to claim 8, in which said time is between 1 and 60 minutes.

12. The method according to claim 1, in which the n-type doped ZnO or ZnMgO is in the form of a substrate and a surface layer of the substrate is transformed respectively into p-type doped ZnO or ZnMgO.

13. The method according to claim 1, in which the n-type doped ZnO or ZnMgO is in the form of nanowires.

* * * * *